United States Patent
Kinzer

(10) Patent No.: US 8,432,145 B2
(45) Date of Patent: Apr. 30, 2013

(54) VOLTAGE SUPPLY CIRCUIT INCLUDING A III-NITRIDE BASED POWER SEMICONDUCTOR DEVICE

(75) Inventor: Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 171 days.

(21) Appl. No.: 11/347,126

(22) Filed: Feb. 2, 2006

(65) Prior Publication Data

US 2006/0181332 A1    Aug. 17, 2006

Related U.S. Application Data

(60) Provisional application No. 60/649,392, filed on Feb. 2, 2005.

(51) Int. Cl.
*G05F 1/56* (2006.01)

(52) U.S. Cl.
USPC .......................... 323/282; 363/124; 323/351

(58) Field of Classification Search ................. 323/282, 323/288, 311, 351; 363/62, 124, 123; 320/166; 327/111
See application file for complete search history.

(56) References Cited

U.S. PATENT DOCUMENTS

| | | | |
|---|---|---|---|
| 3,983,473 A * | 9/1976 | Sanderson | 323/274 |
| 4,427,899 A * | 1/1984 | Bruns | 307/66 |
| 5,838,193 A * | 11/1998 | Myers et al. | 330/10 |
| 5,952,860 A * | 9/1999 | van Saders et al. | 327/219 |
| 6,331,794 B1 * | 12/2001 | Blanchard | 327/112 |
| 6,806,747 B2 * | 10/2004 | Honda et al. | 327/108 |
| 6,914,273 B2 * | 7/2005 | Ren et al. | 257/194 |
| 6,982,204 B2 * | 1/2006 | Saxler et al. | 438/285 |
| 7,112,897 B2 * | 9/2006 | Strong, III | 307/48 |
| 2002/0119610 A1 * | 8/2002 | Nishii et al. | 438/167 |
| 2002/0141213 A1 * | 10/2002 | De Vries | 363/124 |
| 2002/0171405 A1 * | 11/2002 | Watanabe | 323/282 |
| 2004/0140792 A1 * | 7/2004 | Abdoulin | 323/282 |
| 2004/0169980 A1 * | 9/2004 | Amano et al. | 361/93.1 |

FOREIGN PATENT DOCUMENTS

JP          61289723 A  *  12/1986

OTHER PUBLICATIONS

Sedra and Smith, Microelectronic Circuits, 1991, Saunders College Publishing, Third Editon, pp. 317-319.*
Saito, Wataru : 600V AlGaM/GaN Power-HEMT: Design, Fabrication and Demonstration on High Voltage DC-DC Converter, Dec. 8 2003, IEEE Electron Devices Meeting 2003 IEDM '03 Technical Digest, pp. 598-601.*
Saito, W : High breakdown Voltage undoped AlGaN-GaN power HEMT on Sapphire substrate and its demonstration for DC-DC converter application, Nov. 2004, pp. 1913-1917, IEEE Transactions on Electron Devices.*
Ville Saari, Pasi Juurakko, Jussi Ryynanen and Kari Halonen, 13.5 MHz Class-S Modulator for an EER Transmitter, NorChip Conference Proceedings 2004, IEEE, pp. 253-256.*

* cited by examiner

*Primary Examiner* — Harry Behm
(74) *Attorney, Agent, or Firm* — Farjami & Farjami LLP

(57) ABSTRACT

A voltage supply circuit for providing an output DC voltage from an input DC voltage bus that includes a III-nitride based power semiconductor device series connected between the input DC voltage bus and an output capacitor, which is switchable from an on state to an off state in order to charge up the output capacitor.

13 Claims, 1 Drawing Sheet

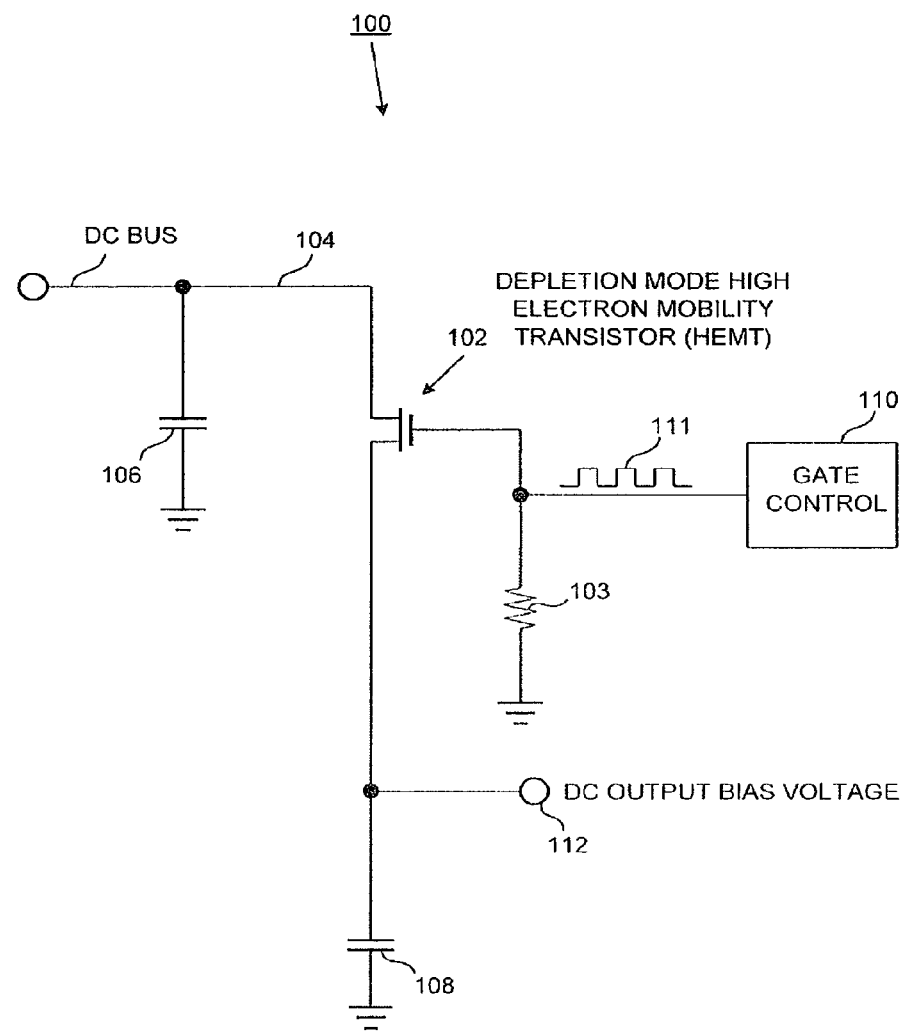

VOLTAGE SUPPLY CIRCUIT INCLUDING A III-NITRIDE BASED POWER SEMICONDUCTOR DEVICE

CROSS-REFERENCE TO RELATED APPLICATIONS

This application is based on and claims priority to U.S. Provisional Application No. 60/649,392, filed on Feb. 2, 2005, by Daniel M. Kinzer, entitled, "GaN DEPLETION MODE TRANSISTOR AS HOUSEKEEPING BIAS SUPPLY HIGH VOLTAGE PASS TRANSISTOR," the contents of which are herein incorporated by reference.

FIELD OF THE INVENTION

This invention relates to power supplies and more specifically, to voltage supply circuit that includes a III-nitride based power semiconductor device.

BACKGROUND AND THE SUMMARY OF THE INVENTION

Applications often require a high voltage DC bus as well as a low DC housekeeping voltage to operate, for example, integrated circuits. It would be desirable to provide a voltage supply circuit that is able to produce a desired DC housekeeping voltage from a high voltage DC bus.

A voltage supply circuit according to the present invention is capable of providing an output DC voltage from and input DC voltage and includes a III-nitride power semiconductor switching device series connected between an input DC voltage bus and an output capacitor.

According to an aspect of the present invention the device is a depletion mode III-nitride power semiconductor device such as GaN-based high electron mobility transistor (HEMT). In one embodiment, the pinch off voltage of a depletion mode III-nitride device in a circuit according to the present invention is used to set the output voltage without a need for complex control circuitry and additional components.

A circuit according to another embodiment further includes a gate controller which is operatively connected to the gate electrode of the III-nitride device. The gate controller may be configured to switch the III-nitride device according to any known switching scheme including preferably pulse width modulation. According to the preferred embodiment of the invention, the gate controller may be a "bang-bang" control that generates a pulse width modulated signal that varies between ground and the desired DC output voltage. By switching the gate of the III-nitride device the output capacitor is charged in a pulse like fashion to the desired DC output voltage. As such, a circuit according to the present invention can be configured to supply any DC output voltage from any DC input voltage.

Other features and advantages of the present invention will become apparent from the following description of the invention which refers to the accompanying drawing.

BRIEF DESCRIPTION OF THE DRAWINGS

FIG. 1 shows a schematic of a voltage supply circuit according to an embodiment of the invention.

DETAIL DESCRIPTION OF THE INVENTION

Referring to FIG. 1, there is shown a schematic of a voltage supply circuit 100 for providing a DC housekeeping voltage from a high voltage DC bus 104 according to an embodiment of the invention. Specifically, voltage supply circuit 100 includes III-nitride based power switchable semiconductor device 102 that is series connected between DC bus 104 and output capacitor 108. Output capacitor 108 is preferably series connected between a power electrode of device 102 and ground. In this arrangement, device 102 can control the charge in and thus the voltage across output capacitor 108. DC bus 104 is a high voltage bus. For example, DC bus 104 may be a 350 volt bus.

According to the preferred embodiment of the present invention, device 102 is a III-nitride based, for example GaN based, depletion mode high electron mobility transistor (HEMT). Such a device may include a heterojunction that includes a GaN layer, and an AlGaN layer to form a two dimensional electron gas that serves as a conduction channel as is well known in the art. It should be noted that although a GaN-based device is preferred, other semiconductor alloys from the InAlGaN system can be used to construct a III-nitride device 102 without deviating from the scope and the spirit of the present invention. Device 102 may be a MIS (metal insulator semiconductor) HEMT or a MES (metal semiconductor) HEMT. A MISHEMT device includes a gate electrode that is insulated from the channel by an intervening insulation layer such as a layer of silicon dioxide, silicon nitride, or the like. A MISHEMT is a device which includes a gate electrode that makes a schottky contact with the III-nitride heterojunction of the device.

A supply circuit 100 preferably further includes input capacitor 106 connected across DC bus 104 and ground in order to reduce the current ripple in the bus 104, and optionally resistor 103 connected to the gate of device 102.

In one embodiment of the present invention the pinchoff voltage of device can be used to set the output voltage. Specifically, because the device is a depletion mode device, the output voltage will rise until the source voltage is high enough relative to the gate voltage to pinch off and limit the current flow to whatever the load requirement may be. Note that in this embodiment resistor 103 is preferred but not necessary. Furthermore, no gate control circuitry may be necessary for this embodiment rendering it less complex and less expensive. Device 102 in a circuit according to the present invention operates in linear mode. Thus, it is best suited for low power applications (less than one Watt) such as housekeeping voltage supplies.

Optionally, voltage supply circuit 100 also includes a gate controller 110. Gate controller 110 is connected to the gate of device 102 and generates a signal 111 that switches the gate, thereby varying the flow of current through device 102, i.e. between an on and off state. The output of voltage supply circuit 100 can be a DC housekeeping voltage obtained at output node 112 (i.e., the junction of capacitor 108 and the source of device 102). Preferably, gate controller 110 is configured to switch the gate of device 102 according to any known pulse width modulation technique in order to maintain the charge in output capacitor 108. As a result, output capacitor 108 is maintained in a desired voltage range, which includes the desired output voltage at output node 112. As an example, the output voltage may be a low voltage, such as 15 volts.

Voltage supply circuit 100 operates as follows. Initially, the gate of device 102 (which is a depletion mode device) is not switched, leaving device 102 in the on state and thereby causing capacitor 108 to charge. In this state, output capacitor 108 charges until the voltage at output node 112 reaches the pinch-off voltage of device 102 at which point device 102 stops conducting. As an example, the pinch-off voltage of device 102 may be about 6 to 8 volts. Thereafter, output capacitor 108 can be charged to any desired voltage by switching the gate between ground and the DC output voltage.

For example, assuming that the desired bias voltage at output 112 is greater than the pinch-off voltage of device 102, controller 110 may generate a modulated signal 111 that switches the gate of device 102 between ground and the desired output voltage until the desired output voltage is reached. If, however, the desired output voltage is less than the pinch-off voltage of device 102, gate controller 110 may generate a negative modulated signal to control device 102 and charge up output capacitor 108 to the desired output voltage. Thus, regardless of the signal form, the switching of the gate causes output capacitor 108 to charge to the desired output voltage. Note that gate controller 110 may be a simple "bang-bang" controller that generates a pulse width modulated signal 111. The on and off pulse duration of signal 111 may be selected to reduce the ripple voltage at output 112. It should be noted that other gate control schemes may be used to operate device 102 without deviating from the scope and the spirit of the present invention. Importantly, the above scheme allows for switch mode operation of device 102 for maximum efficiency.

As can be seen, by changing signal 111 generated by gate controller 110, different desired bias voltages at output 112 may be obtained. As such, according to the present invention, voltage supply circuit 100 can be configured to supply any desired housekeeping bias voltage from a high voltage DC bus 104.

It could be advantageous to integrate III-nitride power device 102 on a common chip with other transistors that are used as switching elements in high power circuits in that it is not difficult to isolate III-nitride based transistors from one another. Such a configuration could address the need for small power supplies for powering control chips and even for start up mode of operation of control chips.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A voltage supply circuit, comprising:
   a depletion mode III-nitride based high electron mobility transistor (HEMT) having a first power electrode connected to a voltage bus and having a pinch-off voltage;
   an output capacitor connected between a second power electrode of said depletion mode III-nitride based HEMT and ground, said output capacitor being charged while said depletion mode III-nitride based HEMT is in an ON state;
   a pulse width generating gate controller configured to provide a control signal to a gate of said depletion mode III-nitride based HEMT;
   a resistor coupling said gate of said depletion mode III-nitride based HEMT to ground; and
   an output node between said output capacitor and said second power electrode of said depletion mode III-nitride based HEMT to provide a desired output voltage;
   wherein said pulse width generating gate controller is operable to adjust said desired output voltage away from said pinch-off voltage using said control signal.

2. The circuit of claim 1, wherein said output voltage is a DC voltage and lower than said bus voltage.

3. The circuit of claim 1, wherein said III-nitride based HEMT is a GaN-based device.

4. The circuit of claim 1, further comprising an input capacitor coupling said voltage bus to ground.

5. The circuit of claim 1, wherein said output voltage is a DC voltage and greater than 10 volts.

6. The circuit of claim 1, wherein said resistor is series connected between said gate of said depletion mode III-nitride based HEMT and ground.

7. The circuit of claim 1, wherein said output capacitor is series connected between said second power electrode of said III-nitride based HEMT and ground.

8. A voltage supply circuit, comprising:
   a depletion mode III-nitride based high electron mobility transistor (HEMT) having a first power electrode connected to a voltage bus and having a pinch-off voltage;
   an output capacitor connected between a second power electrode of said depletion mode III-nitride based HEMT and ground, said output capacitor being charged while said depletion mode III-nitride based HEMT is in an ON state;
   a pulse width generating gate controller configured to provide a control signal to a gate of said depletion mode III-nitride based HEMT;
   an output node between said output capacitor and said second power electrode of said depletion mode III-nitride based HEMT to provide an output voltage;
   wherein said pulse width generating gate controller is operable to generate a negative modulated signal to said depletion mode transistor to charge said output capacitor up to said pinch-off voltage;
   wherein said pulse width generating gate controller is operable to adjust said output voltage away from said pinch-off voltage using said control signal without discharging said output node.

9. The circuit of claim 8, wherein said output voltage is greater than 5 volts.

10. The circuit of claim 8, wherein said III-nitride based HEMT is a GaN-based device.

11. The circuit of claim 8, wherein said voltage bus is a greater than 50 volt bus.

12. The circuit of claim 8, further comprising an input capacitor coupling said voltage bus to ground.

13. The circuit of claim 8, wherein said output capacitor is series connected between said second power electrode of said III-nitride based HEMT and ground.

* * * * *